(12) United States Patent
Nakatani et al.

(10) Patent No.: US 12,693,347 B2
(45) Date of Patent: Jul. 28, 2026

(54) DISCONNECTION DETECTION DEVICE

(71) Applicant: Proterial, Ltd., Tokyo (JP)

(72) Inventors: Katsutoshi Nakatani, Tokyo (JP);
Izumi Fukasaku, Tokyo (JP); Takahiro Sugiyama, Tokyo (JP)

(73) Assignee: Proterial, Ltd., Tokyo (JP)

( * ) Notice: Subject to any disclaimer, the term of this patent is extended or adjusted under 35 U.S.C. 154(b) by 189 days.

(21) Appl. No.: 18/802,558

(22) Filed: Aug. 13, 2024

(65) Prior Publication Data

US 2025/0102598 A1     Mar. 27, 2025

(30) Foreign Application Priority Data

Sep. 21, 2023     (JP) ................................. 2023-155565

(51) Int. Cl.
*G01R 31/54*          (2020.01)
*G01R 19/10*          (2006.01)
*G01R 31/58*          (2020.01)

(52) U.S. Cl.
CPC ............. *G01R 31/54* (2020.01); *G01R 19/10* (2013.01); *G01R 31/58* (2020.01)

(58) Field of Classification Search
CPC ........ G01R 31/54; G01R 19/10; G01R 31/58; G01R 31/086; G01R 31/66; G01R 31/006; G01R 31/52; G05B 15/02
See application file for complete search history.

(56) References Cited

U.S. PATENT DOCUMENTS 5,841,272 A * 11/1998 Smith .................. G01R 15/146
                                                         324/117 R
6,683,448 B1 * 1/2004 Ohtsuka ............... H10N 52/101
                                                         257/E43.003
7,352,164 B2 * 4/2008 Guillon .................. G01R 15/18
                                                         324/117 R
7,463,016 B2 * 12/2008 Shoji .................... G01R 15/205
                                                         324/252
12,480,978 B2 * 11/2025 Marien ................ G01R 15/207

FOREIGN PATENT DOCUMENTS

JP          2007-139488 A      6/2007

* cited by examiner

*Primary Examiner* — Vinh P Nguyen
(74) *Attorney, Agent, or Firm* — McGinn IP Law Group, PLLC

(57)          ABSTRACT

A disconnection detection device that detects strand disconnection in a plurality of insulated wires each of which includes a conductor including a plurality of strands is provided with a branch portion including a common conducting path and a plurality of branched conducting paths branching out from an end portion of the common conducting path, each of the branched conducting paths being electrically connected, at an end portion, to one end of the conductor of the corresponding insulated wire, a current ratio detection unit capable of detecting a ratio of currents flowing through the plurality of branched conducting paths, and a disconnection detection processing unit that detects the strand disconnection in the plurality of insulated wires based on a detection result of the current ratio detection unit.

7 Claims, 8 Drawing Sheets

*FIG.4A*

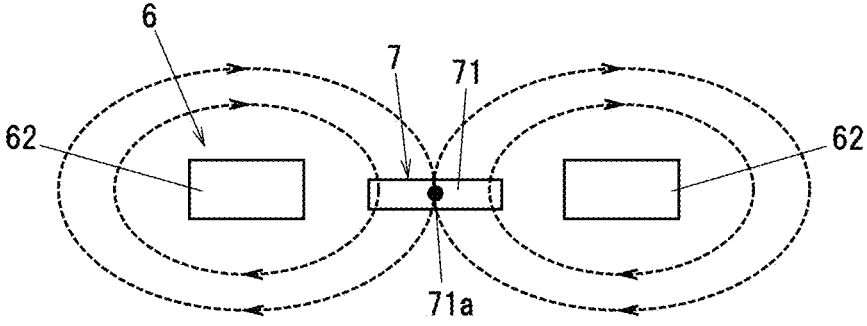

NO STRAND DISCONNECTION IN BOTH INSULATED WIRES

CURRENTS FLOWING THROUGH TWO BRANCHED CONDUCTING PATHS ARE THE SAME

MAGNETIC FIELD DETECTED BY MAGNETIC DETECTION ELEMENT IS ZERO

*FIG.4B*

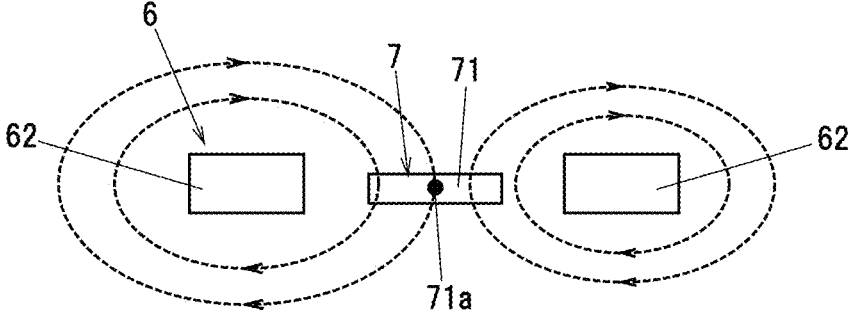

OCCURRENCE OF STRAND DISCONNECTION IN ONE OF INSULATED WIRES

CURRENTS FLOWING THROUGH TWO BRANCHED CONDUCTING PATHS ARE DIFFERENT

MAGNETIC FIELD DETECTED BY MAGNETIC DETECTION ELEMENT BECOMES LARGER

DISCONNECTION DETECTION DEVICE

CROSS-REFERENCE TO RELATED APPLICATIONS

The present patent application claims the priority of Japanese patent application No. 2023-155565 filed on Sep. 21, 2023, the entire contents of which are incorporated herein by reference.

TECHNICAL FIELD

The present invention relates to a disconnection detection device.

BACKGROUND OF THE INVENTION

In cables wired in moving parts of devices such as industrial robots, disconnection (i.e., wire breakage) of strands constituting the conductor proceeds gradually by being subjected to repeated motion, such as bending or twisting, of the moving parts, eventually leading to conductor disconnection. Therefore, it is desirable to detect strand disconnection and replace the cable before reaching disconnection of the entire conductor.

When disconnection occurs in some of strands constituting a conductor, the resistance value of the conductor increases, hence, conventional strand disconnection detection is performed by measuring the resistance value of the conductor. For example, the resistance value of the conductor is measured in its initial state in which no disconnection has occurred, and occurrence of strand disconnection is detected when the resistance value increases from the resistance value in the initial state.

Prior art document information related to the invention of the present application includes Patent Literature 1.

Citation List Patent Literature 1: JP 2007-139488A

SUMMARY OF THE INVENTION

However, the resistance value of the conductor is as small as a unit of mΩ, and the increase in the resistance value of the conductor is extremely small if the number of disconnected (broken) strands in the conductor is small. Furthermore, since the resistivity of a conductor or the contact potential generated between an electrode of a resistance measuring instrument and a conductor being measured varies with temperature, the resistance value of the conductor also varies with temperature, making it difficult to detect a slight increase in the resistance value. Therefore, disconnection cannot be detected until the number of disconnected strands in the conductor becomes large (until the resistance value increases by several tens of percent from the initial value), and it is difficult to detect disconnection at an early stage.

Therefore, it is an object of the invention to provide a disconnection detection device capable of detecting occurrence of strand disconnection with high sensitivity.

To solve the problems described above, the invention provides a disconnection detection device that detects strand disconnection in a plurality of insulated wires each comprising a conductor comprising a plurality of strands, the device comprising:

a branch portion that comprises a common conducting path and a plurality of branched conducting paths branching out from an end portion of the common conducting path, each of the branched conducting paths being electrically connected, at an end portion, to one end of the conductor of the corresponding insulated wire;

a current ratio detection unit capable of detecting a ratio of currents flowing through the plurality of branched conducting paths; and a disconnection detection processing unit that detects the strand disconnection in the plurality of insulated wires based on a detection result of the current ratio detection unit.

According to the invention, it is possible to provide a disconnection detection capable of detecting occurrence of strand disconnection with high sensitivity.

BRIEF DESCRIPTION OF DRAWINGS

FIGS. 4A and 4B are explanatory diagrams illustrating detection of strand disconnection.

FIGS. 7A and 7B are diagrams illustrating a modification of the invention, wherein FIG. 7A is a cross-sectional view showing the cable in a cross section perpendicular to the longitudinal direction, and FIG. 7B is a diagram illustrating the arrangement of the branch portions and the magnetic sensors.

FIGS. 8A and 8B are diagrams illustrating another modification of the invention, wherein FIG. 8A is a cross-sectional view showing the cable in a cross section perpendicular to the longitudinal direction, and FIG. 8B is a diagram illustrating the arrangement of the branch portions and the magnetic sensors.

DETAILED DESCRIPTION OF THE INVENTION

Embodiment

An embodiment of the invention will be described below in conjunction with the appended drawings.

Figure 1:
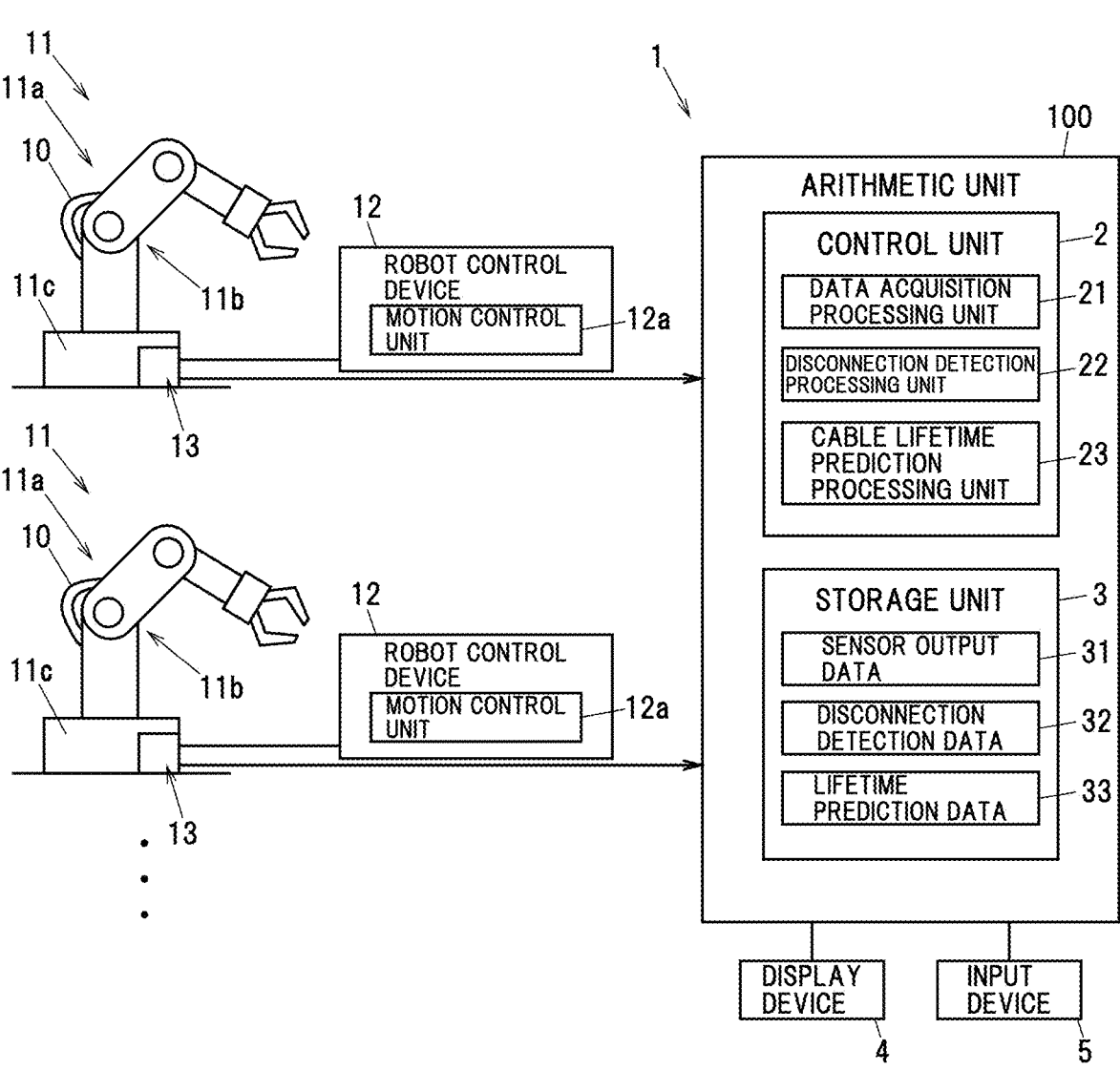
FIG. 1 is a schematic configuration diagram illustrating a disconnection detection device in an embodiment of the present invention.
Figure 2A:
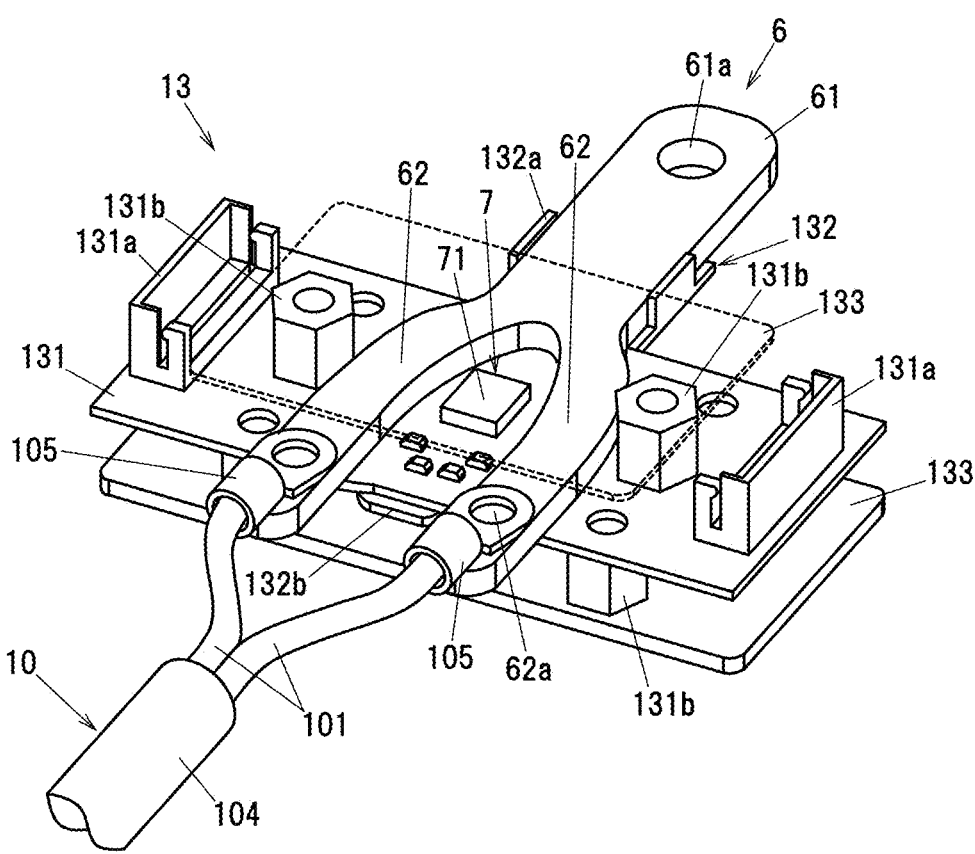
FIG. 2A is a perspective view showing a connector.
Figure 2B:
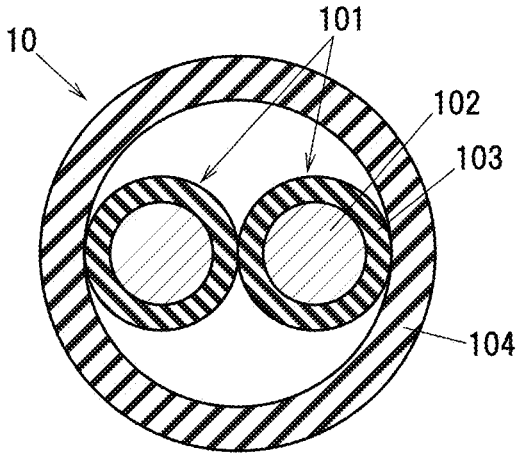
FIG. 2B is a cross-sectional view showing a cable in a cross section perpendicular to its longitudinal direction.

FIG. 1 is a schematic configuration diagram illustrating a disconnection detection device 1 in the present embodiment. FIG. 2A is a perspective view showing a connector 13 and FIG. 2B is a cross-sectional view showing a cable 10 in a cross section perpendicular to its longitudinal direction.

The disconnection detection device 1 is a device that detects disconnection of strands consisting of metal wires and constituting a conductor 102 of the cable 10 wired in a device (a management target device) 11 managed by a device user or a device manufacturer, which is caused by motion such as bending, twisting or shaking applied to the cable 10 due to motion based on the actual operation of the device 11. For example, the device 11 has a moving part 11b and the cable 10 is wired through the moving part 11b. By operating the moving part 11b of the device 11, bending, twisting or shaking, etc. is repeatedly applied to the cable 10. FIG. 1 shows a case where the device 11 in which the cable 10 is wired is an industrial robot 11*a*. The device 11 is not limited thereto and may be a vehicle such as an automobile.

Hereinafter, the term "strand disconnection" means disconnection of each of plural strands constituting the conductor 102 of the cable 10. In addition, the term "disconnection progress state of the conductor 102" means a disconnection rate indicating how many of the plural strands constituting the conductor 102 are disconnected due to motion such as bending, twisting or shaking, etc. repeatedly applied to the cable 10, i.e., the number of disconnected strands out of the total number of the plural strands constituting the conductor 102. The disconnection progress state of the conductor 102 can be expressed by the ratio (%) of the number of disconnected strands to the total number of plural strands constituting the conductor 102. For example, the disconnection progress state of the conductor 102 when the disconnection rate is 100% indicates the state in which all the plural strands constituting the conductor 102 are disconnected. That is, it can be said that the disconnection progress state of the conductor 102 is the disconnection progress state of the cable 10.

In addition, the term "disconnection of the conductor 102" means that the disconnection rate of strands constituting the conductor 102 has reached a preset rate where it is determined that the conductor 102 is disconnected. For example, the point at which the rate of increase in the resistance value of the conductor 102 constituting the cable 10 (the rate of increase in the resistance value of the conductor 102 with respect to its initial resistance value) becomes not less than 20% is set as a state of the conductor 102 determined to be disconnected, and the strand disconnection rate (=the disconnection progress state of the conductor 102) at this point is, e.g., not less than 80%. The disconnection of the conductor 102 is a criterion for judging that the cable 10 has reached the end of its life, and it serves as an indicator to prompt replacement of the cable 10. Therefore, the lifetime of the cable 10 can be predicted by predicting the time when the conductor 102 will reach disconnection.

A robot control device 12 to control the industrial robot 11*a* is connected to the industrial robot 11*a*. A motion control unit 12*a* to control motion of the industrial robot 11*a* (motion of the moving part 11*b*) is mounted on the robot control device 12. A motion program (not shown) in which the sequence of motion, angle and speed of motion, etc. of the moving part 11*b* are set in advance is stored in the robot control device 12, and the motion control unit 12*a* operates the moving part 11*b* according to the motion program.

Disconnection Detection Device 1

The disconnection detection device 1 is a device that detects strand disconnection in plural insulated wires 101 each having the conductor 102 composed of plural strands. The disconnection detection device 1 includes a branch portion 6 and a current ratio detection unit 7 which are attached inside the connector 13 provided on a base portion 11*c* of the industrial robot 11*a*, and an arithmetic unit 100. The connector 13 in which the branch portion 6 and the current ratio detection unit 7 are attached should be provided at a portion that is connected to an end of the cable 10 to be subjected to disconnection detection. Therefore, the connector 13 may be provided on a portion of the industrial robot 11*a* other than the base portion 11*c* (may be provided on, e.g., the moving part 11*b*, etc.).

Branch Portion 6

The branch portion 6 has a common conducting path 61, and plural branched conducting paths 62 (the same number as the insulated wires 101) branching out from an end portion of the common conducting path 61. Then, each of the branched conducting paths 62 is electrically connected, at an end portion, to one end of the conductor 102 of the corresponding insulated wire 101. A current supplied from the common conducting path 61 is thus supplied to the plural insulated wires 101 through the plural branched conducting paths 62.

As shown in FIGS. 2A and 2B, in the present embodiment, the number of insulated electric wires 101 to be subjected to disconnection detection is two. However, the number of insulated electric wires 101 to be subjected to disconnection detection is not limited thereto and may be not less than three. The cable 10 has two insulated wires 101 each having the conductor 102 and an insulation 103 therearound, and a sheath 104 that covers the two insulated wires 101 together. The two insulated wires 101 preferably have the same configuration, and desirably have the same length, the same conductor cross-sectional area, and the same resistance value. The other ends of the two insulated wires 101 are connected to the same connection point. That is, plural (two in this example) insulated electric wires 101 and branched conducting paths 62 connected in series are connected in parallel between the connection point of the cable 10 and the common conducting path 61. In this regard, the cable 10 can be also described as having two insulated wires 101 which are formed by dividing the conductor 102 in the sheath 104 into two parts and covering each part with the insulation 103.

Figure 3:
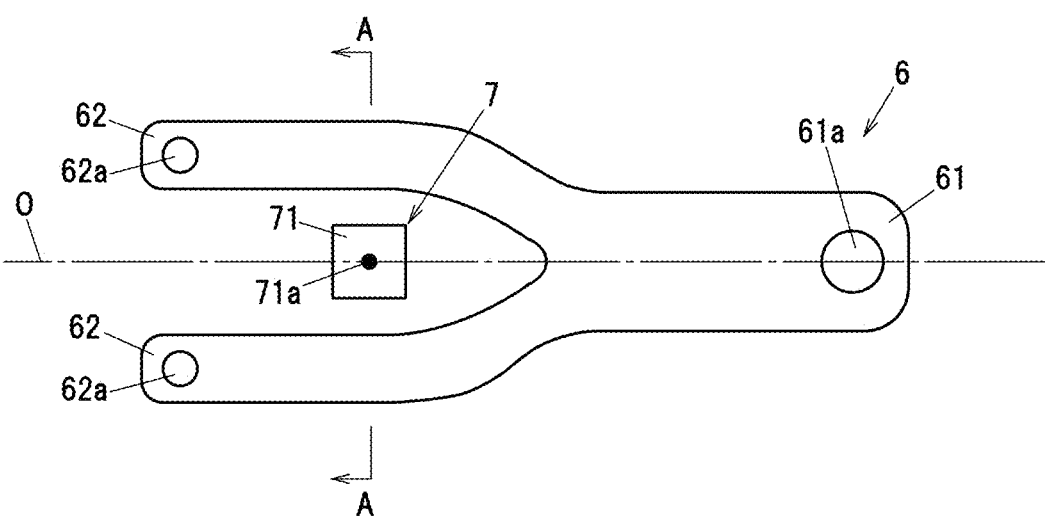
FIG. 3 is a plan view showing a branch portion and a magnetic sensor.

In addition, in the present embodiment, the branch portion 6 is composed of a busbar, which is a plate-shaped conducting path, and has a plate shape as a whole. The common conducting path 61 is formed in a substantially rectangular plate shape, and a bolt hole 61*a* is formed at its base end portion to bolt fix and electrically connect an end of a cable (not shown) extending from the robot control device 12. At an end portion (an end opposite to the base end portion) of the common conducting path 61, the branch portion 6 has two branched conducting paths 62 corresponding to the two insulated wires 101 to be subjected to disconnection detection. As shown in FIGS. 2A and 3, the two branched conducting paths 62 are provided integrally with the common conducting path 61 and branch out from the end portion of the common conducting path 61 in a substantially Y-shape in plan view. The both branched conducting paths 62 extend along the direction of the long side of the common conducting path 61, a bolt hole 62*a* to bolt fix a terminal 105 provided at an end of the insulated electric wire 101 is formed at an end portion of each of the two branched conducting paths 62, and the end portions of the both branched conducting paths 62 are respectively electrically connected to ends of the conductors 102 of the insulated electric wires 101. The two branched conducting paths 62 are formed in the same shape and are configured to have the same cross-sectional area, cross-sectional shape, planar shape, and resistance value. As shown in FIG. 3, the branch portion 6 is symmetric with respect to a central axis O passing through the center of the common conducting path 61 in plan view.

The specific shape of the branch portion 6 can be changed as appropriate. For example, the branch portion 6 does not need to have a plate shape, and the cross-sectional shape of the branch portion 6 may be a circular shape, an elliptical shape or a polygonal shape, etc.

Current Ratio Detection Unit 7

The current ratio detection unit 7 is to detect a ratio of currents respectively flowing through the plural branched conducting paths 62. In the present embodiment, the current ratio detection unit 7 is composed of a magnetic sensor 71 arranged between the two branched conducting paths 62. The magnetic sensor 71 is composed of a magnetic detection element such as a Hall element or a GMR (Giant Magneto Resistive effect) element. As shown in FIG. 3, the magnetic sensor 71 is arranged such that a magnetic detection portion 71*a* thereof is located at a midpoint between the two branched conducting paths 62 (at a position overlapping with the central axis O). To improve the accuracy of disconnection detection, the magnetic sensor 71 is desirably arranged such that the magnetic detection portion 71*a* is located at the center in the thickness and width directions of the branch portion 6. In addition, the magnetic sensor 71 is desirably arranged so as to avoid the vicinity of the common conducting path 61 and the end portions of the branched conducting paths 62 (near the portions connected to the insulated electric wires 101) since disturbances in the magnetic field occur in the vicinity of the common conducting path 61 and the end portions of the branched conducting paths 62.

As shown in FIG. 4A, when there is no strand disconnection in both the two insulated wires 101, the currents flowing through the two branched conducting paths 62 are equal and magnetic fields generated by the currents flowing through the two branched conducting paths 62 cancel each other out at the magnetic detection portion 71*a* of the magnetic sensor 71 which is equidistant from the two branched conducting paths 62. Therefore, the magnetic field strength detected by the magnetic sensor 71 is zero. In other words, when there is no strand disconnection in both the two insulated wires 101, the ratio of the currents flowing through the two branched conducting paths 62 hardly changes from the initial state, and the magnetic field strength detected by the magnetic sensor 71 also hardly changes from the initial state. Therefore, based on the sensor output of the magnetic sensor 71, it is possible to detect that no strand disconnection has occurred in the two insulated wires 101.

On the other hand, as shown in FIG. 4B, when strand disconnection occurs in one of the insulated wires 101, the resistance of the conductor 102 slightly increases in the insulated wire 101 in which strand disconnection has occurred, resulting in that a difference occurs between the currents flowing through the two branched conducting paths 62. As a result, a difference occurs at the magnetic detection portion 71*a* of the magnetic sensor 71 between the magnetic fields generated by the currents flowing through the two branched conducting paths 62, and the magnetic field strength (the absolute value of the magnetic field strength) detected by the magnetic sensor 71 becomes larger. In other words, when strand disconnection occurs in at least one of the insulated wires 101, the ratio of the currents flowing through the two branched conducting paths 62 changes from the initial state and the magnetic field strength detected by the magnetic sensor 71 also changes from the initial state. Therefore, based on the sensor output of the magnetic sensor 71, it is possible to detect that strand disconnection has occurred in either of the two insulated wires 101.

Referring back to FIG. 2A, the magnetic sensor 71 serving as the current ratio detection unit 7 is mounted on a circuit board 131. The circuit board 131 and the branch portion 6 are arranged so as to overlap in the thickness direction. The circuit board 131 and the branch portion 6 are fixed to each other by a resin fixing member 132 that has a sandwiching portion 132*a* sandwiching and holding the common conducting path 61 in the width direction, and a fixed portion 132*b* fixed to the back surface of the circuit board 131. On the circuit board 131, a circuit to perform signal processing, etc. for the magnetic sensor 71 is mounted and a connector portion 131*a* used to, e.g., output the sensor output of the magnetic sensor 71 is provided. The sensor output which is output from the connector portion 131*a* is input to the arithmetic unit 100. Shield plates 133 are provided on the front and back surfaces of the circuit board 131 through spacers 131*b* to suppress the influence of external magnetic fields on the magnetic sensor 71. In FIG. 2A, the shield plate 133 on the upper side of the drawing is indicated by a dashed line.

Although the magnetic sensor 71 is mounted on the circuit board 131 in the present embodiment, the magnetic sensor 71 may not be mounted on the circuit board 131. For example, the structure may be such that a lead frame with a predetermined position punched out is used, the magnetic sensor 71 is placed in the punched-out portion, and the lead frame and the magnetic sensor 71 are connected by wire bonding, etc.

In addition, although the magnetic sensor 71 is used as the current ratio detection unit 7 in the present embodiment, the current ratio detection unit 7 is not limited to the magnetic sensor 71 and may be anything that can directly detect the ratio (proportion) of the currents flowing through the two branched conducting paths 62. For example, the current ratio detection unit 7 may be composed of an ammeter provided between the two branched conducting paths 62.

Arithmetic Unit 100

The arithmetic unit 100 has a control unit 2 and the storage unit 3. The disconnection detection device 1 is also connected to a display device 4, and is configured to be able to display various information such as results of disconnection detection on the display device 4. An input device 5 such as a keyboard is also provided on the disconnection detection device 1 so that various settings and manipulation of the display contents on the display device 4 can be performed by input from the input device 5. The display device 4 may be configured as a touch panel display so that the display device 4 also serves as the input device 5. Furthermore, the connection of the display device 4 and the input device 5 to the disconnection detection device 1 does not need to be by wire and may be wireless connection. In this case, the display device 4 or the input device 5 may be, e.g., a smartphone or a tablet. The arithmetic unit 100 may be provided as an arithmetic part in the robot control device 12.

The control unit 2 has a data acquisition processing unit 21, a disconnection detection processing unit 22, and a cable lifetime prediction processing unit 23. The data acquisition processing unit 21, the disconnection detection processing unit 22 and the cable lifetime prediction processing unit 23 are realized by appropriately combining an arithmetic element such as a CPU, a memory such as RAM or ROM, software, interface, and a storage device, etc.

Data Acquisition Processing Unit 21

The data acquisition processing unit 21 performs data acquisition processing to acquire the sensor output of the magnetic sensor 71 which serves as the current ratio detection unit 7. The data acquisition processing unit 21 stores the acquired sensor output of the magnetic sensor 71 as sensor output data 31 in the storage unit 3.

Disconnection Detection Processing Unit 22

The disconnection detection processing unit 22 performs disconnection detection processing to detect strand disconnection in the plural (two in this example) insulated wires 101 based on the detection result of the current ratio detection unit 7, i.e., the sensor output data 31 which is data of the sensor output of the magnetic sensor 71 acquired by the data acquisition processing unit 21.

Figure 5:
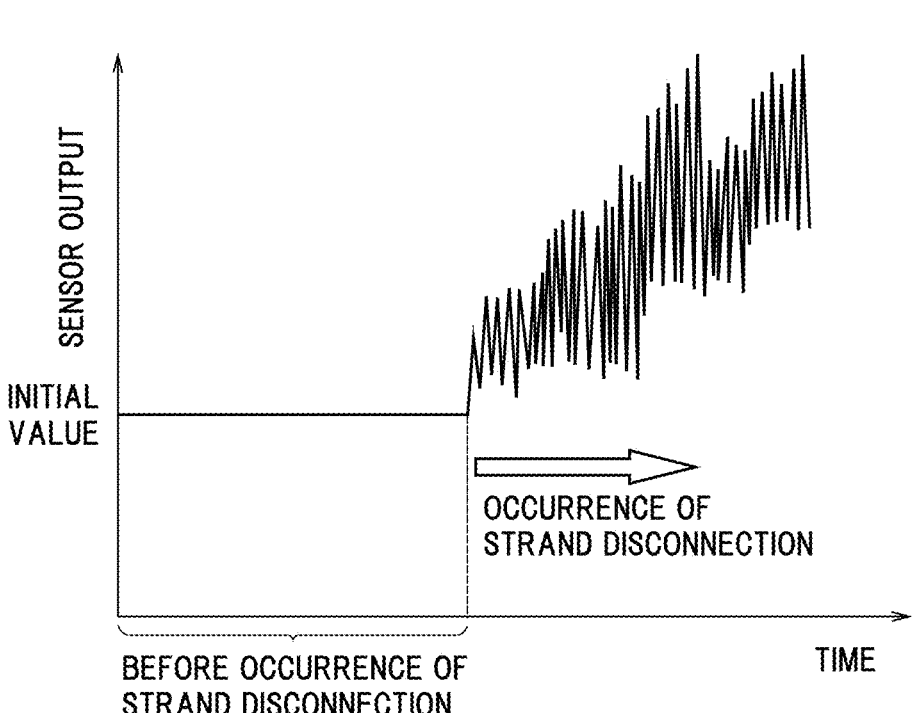
FIG. 5 is a diagram illustrating an example of sensor output of the magnetic sensor.

FIG. 5 is a diagram illustrating an example of the sensor output of the magnetic sensor 71 before and after occurrence of strand disconnection. As shown in FIG. 5, before strand disconnection occurs, the magnetic field strength detected by the magnetic sensor 71 is zero because the magnetic fields from the two branched conducting paths 62 cancel each other out, and the sensor output of the magnetic sensor 71 has a constant value (hereinafter, referred to as the initial value). Then, once strand disconnection occurs, the magnetic fields from two branched conducting paths 62 become unbalanced, the absolute value of the magnetic field strength detected by the magnetic sensor 71 becomes larger, and the sensor output changes from the initial value. Based on the change in the sensor output from the initial value, the disconnection detection processing unit 22 detects that strand disconnection has occurred (i.e., initial disconnection has occurred). The disconnection detection processing unit 22 may issue a warning (an alarm) when detected strand disconnection. The disconnection detection processing unit 22 stores the result of disconnection detection (the determination result) as disconnection detection data 32 in the storage unit 3.

The greater the number of disconnected strands, that is, the more advanced the disconnection progress state, the greater the difference of the sensor output from the initial value. Therefore, the disconnection detection processing unit 22 may be configured to detect the disconnection progress state of the conductor 102 based on the detection result of the current ratio detection unit 7 (more specifically, the change in the sensor output from the initial value). When detecting the disconnection progress state of the conductor 102, threshold values for the sensor output are set stepwise in advance, and when the value of the sensor output data 31 becomes more than the set threshold value, it is possible to detect that disconnection of the conductor 102 is progressing.

Cable Lifetime Prediction Processing Unit 23

The cable lifetime prediction processing unit 23 performs cable lifetime prediction processing to predict the time to the disconnection of the conductor 102, i.e., the time until the cable 10 reaches the end of its life (hereinafter, referred to as the cable lifetime), based on the detection result of the current ratio detection unit 7 (more specifically, the change in the sensor output from the initial value). The cable lifetime prediction processing unit 23 may predict how much time will elapse from the present time before the cable lifetime is reached, based on, e.g., the period of time (or the number of motions) from when the cable 10 starts to be used until the initial disconnection occurs or a predetermined disconnection progress state is reached. The prediction result in the cable lifetime prediction processing is stored as lifetime prediction data 33 in the storage unit 3. In this regard, the cable lifetime prediction processing unit 23 is not essential and can be omitted.

Disconnection Detection Method

Figure 6:
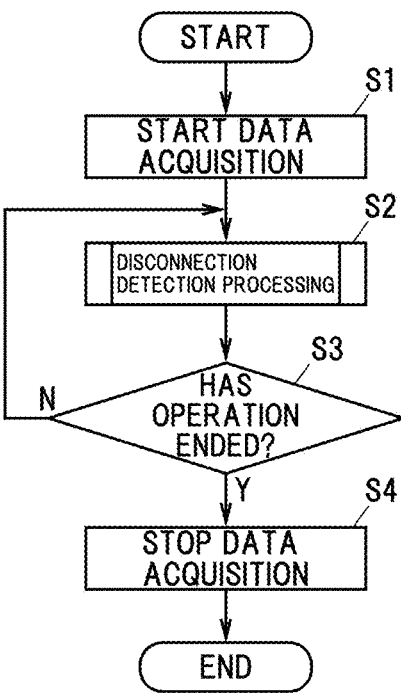
FIG. 6 is a flowchart showing a disconnection detection method in the embodiment of the invention.

FIG. 6 is a flowchart showing a disconnection detection method in the present embodiment. The flow shown in FIG. 6 is started when, e.g., the device 11 starts operating. As shown in FIG. 6, first, the data acquisition processing unit 21 starts acquiring the sensor output of the magnetic sensor 71 in Step S1. The acquired data of the sensor output is stored as the sensor output data 31 in the storage unit 3. The sensor output data acquisition may be performed continuously throughout the entire period of time during which the device 11 is in operation, or may be performed every predetermined period of time. The sensor output data acquisition may also be performed during periods when the device 11 is not in operation, such as during maintenance work. By performing the sensor output data acquisition while the device 11 is in operation, it is possible to detect the disconnection progress state of the conductor 102 corresponding to the operating state of the device 11.

After that, the disconnection detection processing is performed in Step S2. In the disconnection detection processing, the disconnection detection processing unit 22 detects whether strand disconnection has occurred (whether strand disconnection has started to occur), based on the sensor output acquired in Step S1. For example, the initial value of the sensor output is stored in advance, and when the difference between the initial value and the sensor output becomes more than a predetermined threshold value, it is possible to detect that strand disconnection has occurred. In addition, in Step S2, for example, whether the conductor 102 has reached a predetermined disconnection progress state can be detected by appropriately adjusting the threshold value. The detection result is stored as the disconnection detection data 32 in the storage unit 3. Although not shown in the drawing, in the disconnection detection processing, the detection result may be displayed on the display device 4, and an alert may be issued when strand disconnection is detected. In addition, the disconnection detection data 32 obtained by the disconnection detection processing may be used to obtain other data for monitoring the condition of the cable 10. For example, the configuration may be such that images of the operating status of the cable 10 wired in the industrial robot 11a is started to be captured with a camera, etc., in the robot control device 12 when the disconnection detection data 32 becomes more than a predetermined threshold value, and image capturing processing is performed to store data (image data) captured during a predetermined period of time in a storage unit of the robot control device 12 or of the arithmetic unit. The image data stored in the storage unit can be used to stop the operation of the industrial robot 11a or replace the cable 10.

After that, in Step S3, it is determined whether the operation of the device 11 has ended. When the determination made in Step S3 is NO, the process returns to Step S2. When the determination made in Step S3 is YES, the data acquisition by the data acquisition processing unit 21 is finished in Step S4 and the process then ends. Although not shown in the drawing, the cable lifetime prediction processing may be performed after Step S4.

Modification

Even when there is no strand disconnection, the sensor output of the magnetic sensor 71 may not become exactly zero for various reasons, such as manufacturing errors in the branch portion 6, even though it is not mentioned in the embodiment. In this case, strand disconnection may be detected based on a change in the sensor output relative to the normal state (the state before occurrence of strand disconnection).

In addition, in the present embodiment, the branched conducting paths 62 have the same configuration and the insulated wires 101 have the same configuration so that the currents respectively flowing through the branched conducting paths 62 are equal. However, it is not limited thereto, and the branched conducting paths 62 or the insulated wires 101 may have different configurations. In this case, the output from the magnetic sensor 71 does not become zero even when there is no strand disconnection, but strand disconnection can be detected based on a change in the sensor output relative to the normal state (the state before occurrence of strand disconnection) as described above.

Figure 7A:
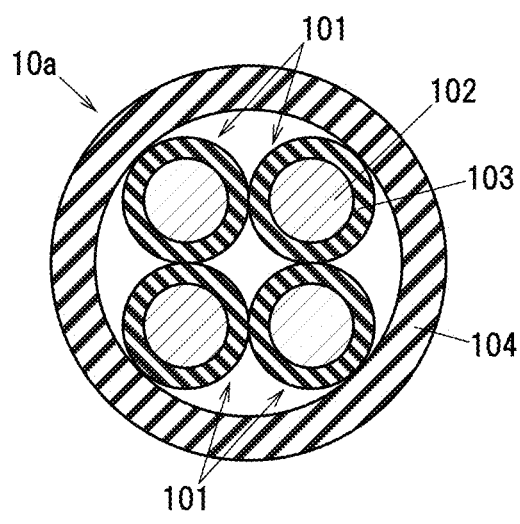
Figure 7B:
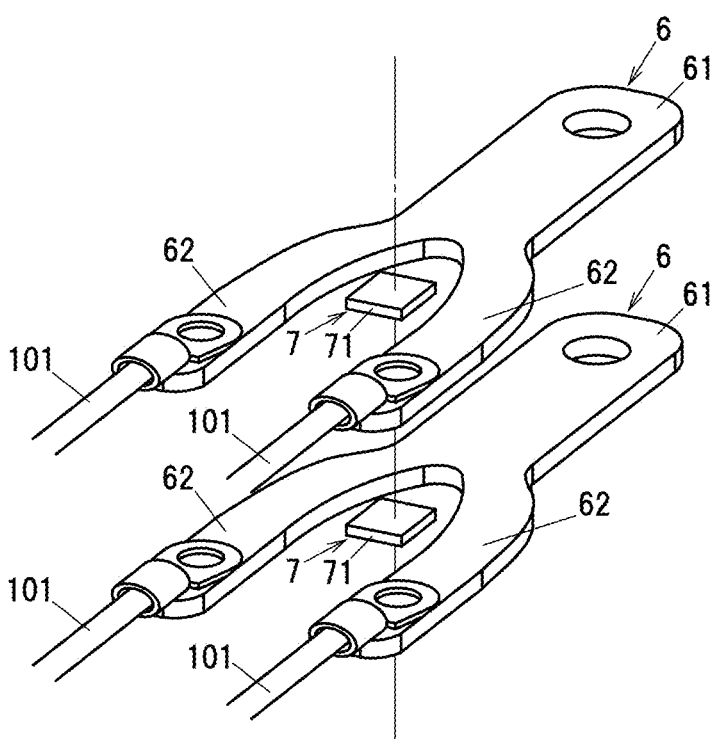

In addition, in the present embodiment, two insulated electric wires 101 are to be subjected to disconnection detection. However, it is not limited thereto, and not less than three insulated electric wires 101 may be to be subjected to disconnection detection. For example, when a cable 10a having four insulated wires 101 as shown in FIG. 7A is to be subjected to disconnection detection, two branch portions 6 and magnetic sensors 71 may be aligned in the thickness direction of the branch portion 6 (in a direction perpendicular to the alignment direction of the branched conducting paths 62 and the longitudinal direction of the branched conducting paths 62) as shown in FIG. 7B. This suppresses, e.g., an impact of the current flowing through the branch portion 6 located on the upper side in the drawing on detection by the magnetic sensor 71 located on the lower side in the drawing. The distance between the branch portions 6 may be set to provide sufficient insulation.

Figure 8A:
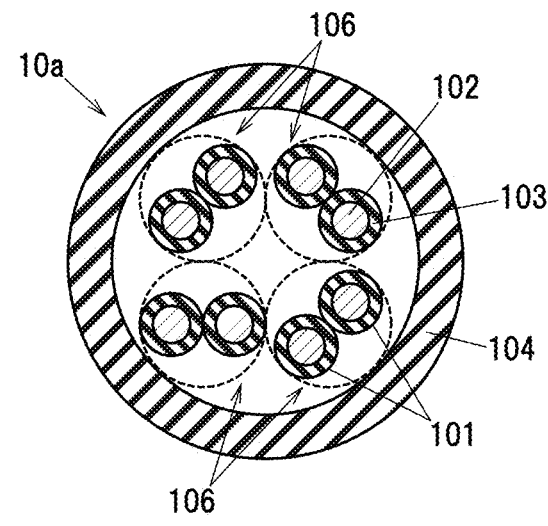
Figure 8B:
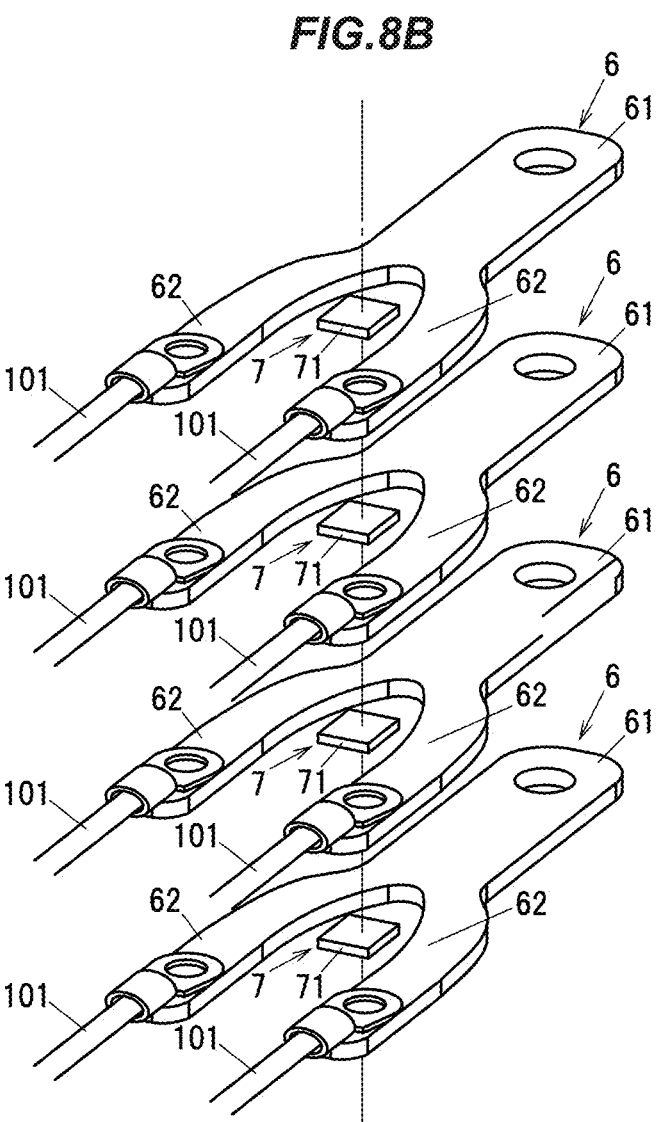

Similarly, when a cable 10b having four twisted pairs 106, i.e., eight insulated wires 101 as shown in FIG. 8A is to be subjected to disconnection detection, four branch portions 6 and magnetic sensors 71 respectively corresponding to the twisted pairs 106 may be used and aligned in the thickness direction as shown in FIG. 8B. The influence of external noise can be further reduced by using the twisted pairs 106.

Furthermore, disconnection detection taking into consideration the operating frequency of the moving part 11b of the device 11 is also possible, even though it is not mentioned in the embodiment. When the moving part 11b operates in the state in which strand disconnection has occurred, the distance between the strands at the location of disconnection (the distance between the disconnected strands) increases or decreases with the motion, and the resistance value of the conductor 102 changes with the motion of the moving part 11b. Therefore, the time-series change in the sensor output (the ratio of the currents flowing through the two branched conducting paths 62) is measured while operating the moving part 11b at a certain cycle, and strand disconnection and the disconnection progress state of the conductor 102 can be detected based on the operating frequency component (or its higher-order frequency component) obtained by performing frequency analysis on the measured sensor output.

Functions and Effects of the Embodiment

As described above, the disconnection detection device 1 in the present embodiment includes the branch portion 6 which has the common conducting path 61 and the plural branched conducting paths 62 branching out from an end portion of the common conducting path 61 and is configured such that each of the branched conducting paths 62 is electrically connected, at an end portion, to one end of the conductor 102 of the corresponding insulated wire 101, the current ratio detection unit 7 capable of detecting the ratio of the currents flowing through the plural branched conducting paths 62, and the disconnection detection processing unit 22 that detects strand disconnection in the plural insulated wires 101 based on a detection result of the current ratio detection unit 7.

With this configuration, strand disconnection and the disconnection progress state of the conductor 102 can be detected with high sensitivity based on the ratio of the currents flowing through the branched conducting paths 62. In addition, in the embodiment, strand disconnection and the disconnection progress state of the conductor 102 constituting the cable 10 wired in a device can be detected without a reference such as current value. As a result, the timing of replacement of the cable 10, etc. can be predicted with high accuracy.

SUMMARY OF THE EMBODIMENT

Next, the technical concepts that can be grasped from the above embodiment will be described with the help of the codes, etc. in the embodiment. However, each sign, etc. in the following description is not limited to the members, etc. specifically shown in the embodiment for the constituent elements in the scope of claims.

According to the first feature, a disconnection detection device is a device that detects strand disconnection in a plurality of insulated wires 101 each comprising a conductor 102 comprising a plurality of strands, the device 1 comprising: a branch portion 6 that comprises a common conducting path 61 and a plurality of branched conducting paths 62 branching out from an end portion of the common conducting path 61, each of the branched conducting paths 62 being electrically connected, at an end portion, to one end of the conductor 102 of the corresponding insulated wire 101; a current ratio detection unit 7 capable of detecting a ratio of currents flowing through the plurality of branched conducting paths 62; and a disconnection detection processing unit 22 that detects the strand disconnection in the plurality of insulated wires 101 based on a detection result of the current ratio detection unit 7.

According to the second feature, in the disconnection detection device 1 as described in the first feature, other ends of the plurality of insulated wires 101 are connected to the same connection point, and a plurality of the insulated wires 101 and the branched conducting paths 62 connected in series are connected in parallel between the connection point and the common conducting path 61.

According to the third feature, in the disconnection detection device 1 as described in the first feature, the branch portion 6 comprises two branched conducting paths 62, and the current ratio detection unit 7 comprises a magnetic sensor 71 arranged between the two branched conducting paths 62.

According to the fourth feature, in the disconnection detection device 1 as described in the third feature, the branch portion 6 comprises a busbar.

According to the fifth feature, in the disconnection detection device 1 as described in the fourth feature, the two branched conducting paths 62 have the same shape and two insulated wires 101 connected to the two branched conducting paths 62 have the same configuration, and the magnetic sensor 71 is arranged so that a magnetic detection portion 71a thereof is located at a midpoint between the two branched conducting paths 62.

According to the sixth feature, the disconnection detection device 1 as described in the fourth feature comprises a plurality of the branch portions 6 and the magnetic sensors 71 that are aligned in a direction perpendicular to an alignment direction of the branched conducting paths 62 and to a longitudinal direction of the branched conducting paths 62.

According to the seventh feature, in the disconnection detection device 1 as described in the first feature, the disconnection detection processing unit 22 detects a disconnection progress state of the conductor 102 based on a detection result of the current ratio detection unit 7.

The above description of the embodiment of the invention does not limit the invention as claimed above. It should also be noted that not all of the combinations of features described in the embodiment are essential to the means for solving the problems of the invention. In addition, the invention can be implemented with appropriate modifications to the extent that it does not depart from the gist of the invention

The invention claimed is:

1. A disconnection detection device that detects strand disconnection in a plurality of insulated wires each comprising a conductor comprising a plurality of strands, the device comprising:

a branch portion that comprises a common conducting path and a plurality of branched conducting paths branching out from an end portion of the common conducting path, each of the branched conducting paths being electrically connected, at an end portion, to one end of the conductor of the corresponding insulated wire;

a current ratio detection unit capable of detecting a ratio of currents flowing through the plurality of branched conducting paths; and a disconnection detection processing unit that detects the strand disconnection in the plurality of insulated wires based on a detection result of the current ratio detection unit.

2. The disconnection detection device according to claim 1, wherein other ends of the plurality of insulated wires are connected to a same connection point, and wherein a plurality of the insulated wires and the branched conducting paths connected in series are connected in parallel between the connection point and the common conducting path.

3. The disconnection detection device according to claim 1, wherein the branch portion comprises the branched conducting path comprising two branched conducting paths, and wherein the current ratio detection unit comprises a magnetic sensor arranged between the two branched conducting paths.

4. The disconnection detection device according to claim 3, wherein the branch portion comprises a busbar.

5. The disconnection detection device according to claim 4, wherein the two branched conducting paths have a same shape and the insulated wire comprising two insulated wires connected to the two branched conducting paths have a same configuration, and wherein the magnetic sensor is arranged so that a magnetic detection portion thereof is located at a midpoint between the two branched conducting paths.

6. The disconnection detection device according to claim 4, comprising:

a plurality of the branch portions and the magnetic sensors that are aligned in a direction perpendicular to an alignment direction of the branched conducting paths and to a longitudinal direction of the branched conducting paths.

7. The disconnection detection device according to claim 1, wherein the disconnection detection processing unit detects a disconnection progress state of the conductor based on a detection result of the current ratio detection unit.

* * * * *